(12) United States Patent
Zhang et al.

(10) Patent No.: US 10,383,441 B1
(45) Date of Patent: Aug. 20, 2019

(54) SERVER RACK

(71) Applicant: HONGFUJIN PRECISION ELECTRONICS (TIANJIN) CO., LTD., Tianjin (CN)

(72) Inventors: Ya-Ni Zhang, Tianjin (CN); Ming-Pei Zhang, TianJin (CN); Sheng-Hung Lee, New Taipei (TW)

(73) Assignee: HONGFUJIN PRECISION ELECTRONICS(TIANJIN)CO., LTD., Tianjin (CN)

( * ) Notice: Subject to any disclaimer, the term of this patent is extended or adjusted under 35 U.S.C. 154(b) by 0 days.

(21) Appl. No.: 15/969,424

(22) Filed: May 2, 2018

(30) Foreign Application Priority Data

Apr. 17, 2018  (CN) .......................... 2018 1 0344343

(51) Int. Cl.
*A47B 88/48* (2017.01)
*H05K 7/16* (2006.01)

(52) U.S. Cl.
CPC .............. *A47B 88/48* (2017.01); *H05K 7/16* (2013.01)

(58) Field of Classification Search
CPC ................................... A47B 88/48; H05K 7/16
See application file for complete search history.

(56) References Cited

U.S. PATENT DOCUMENTS

| | | | | |
|---|---|---|---|---|
| 5,169,221 A | * | 12/1992 | Wheeler | H05K 7/16 16/358 |
| 7,722,139 B1 | * | 5/2010 | Chen | A47B 88/427 312/330.1 |
| 2004/0228098 A1 | * | 11/2004 | Robbins | H01R 25/006 361/725 |
| 2014/0265775 A1 | * | 9/2014 | Grziwok | F16M 11/08 312/246 |

* cited by examiner

*Primary Examiner* — Matthew W Ing
(74) *Attorney, Agent, or Firm* — ScienBiziP, P.C.

(57) ABSTRACT

A server rack includes two opposing fixing frames, a side plate fixed to each fixing frame and a supporting rail extending from each side plate, the supporting rails extending toward each other. The two side plates are opposite and parallel to each other. The server rack further includes two rotatable guiding members, each is fixed to a free end of the side plate away from the fixing frame. The guiding member includes a base plate positioned on a side of the side plate and a guiding portion inwardly depressed from the base plate. For ease of installation, wedge portions of the guiding portions receive the edges of a server being installed and guide the edges accurately towards the supporting rails.

20 Claims, 3 Drawing Sheets

SERVER RACK

FIELD

The subject matter herein generally relates to a server rack.

BACKGROUND

Server racks accommodate individual servers. Typically, the server rack includes two opposite side plates and two guide rails extending from an inner sides of each of the two side plates. The server is placed on the guide rail and installed in the server rack. The guide rail extends from a front end of the side plate to a rear end of the side plate and a distance between the two side plates is equal to a width of the server. When the server is placed on the slide rail, opposite ends of the server should be simultaneously placed between the two opposite side plates, which can be inconvenient when installing the server. Therefore, there is room for improvement within the art.

BRIEF DESCRIPTION OF THE DRAWINGS

Implementations of the present technology will now be described, by way of example only, with reference to the attached figures.

DETAILED DESCRIPTION

Figure 1:
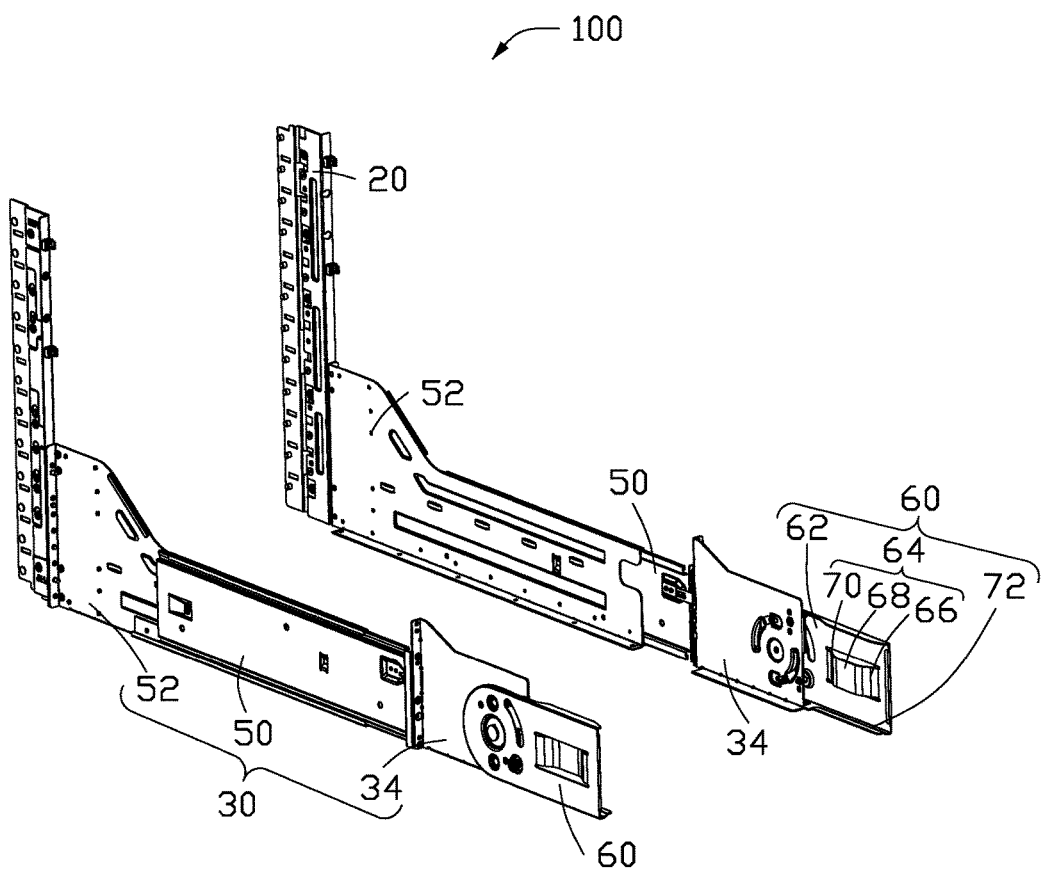
FIG. 1 is an isometric view of an embodiment of a server rack.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein. The disclosure is illustrated by way of example and not by way of limitation in the figures of the accompanying drawings, in which like references indicate similar elements. It should be noted that references to "an" or "one" embodiment in this disclosure are not necessarily to the same embodiment, and such references mean "at least one."

The term "comprising" means "including, but not necessarily limited to"; it specifically indicates open-ended inclusion or membership in a so-described combination, group, series, and the like.

Figure 2:
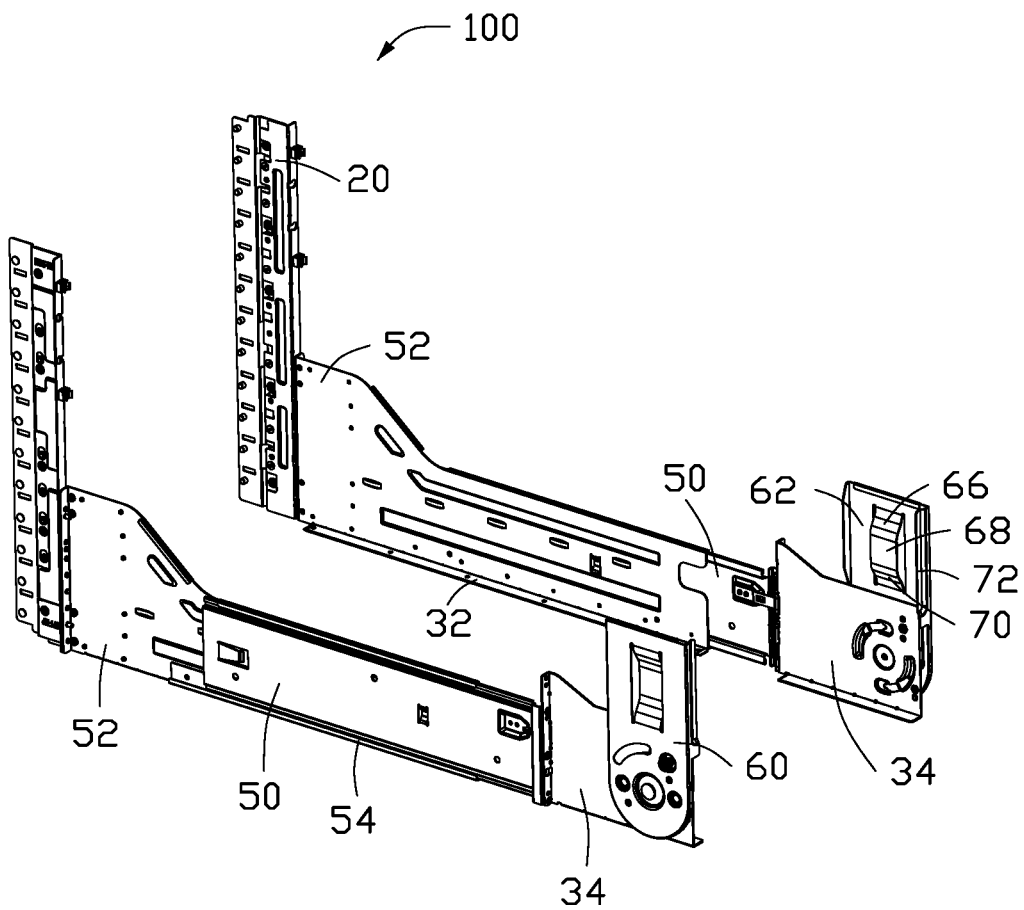
FIG. 2 is similar to FIG. 1, but with a rotating member positioned at a second position.
Figure 3:
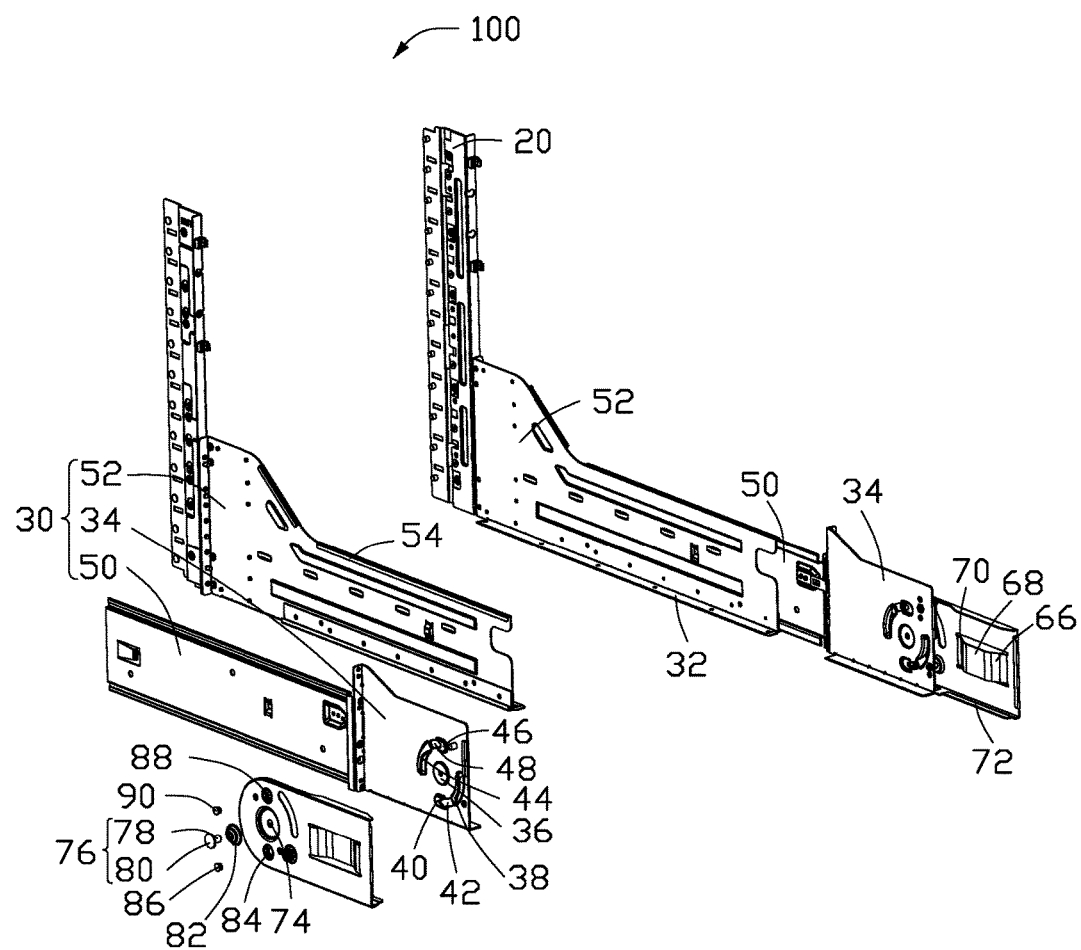
FIG. 3 is an exploded view of the server rack of FIG. 1.

FIG. 1 to FIG. 3 illustrate a server rack 100. The server rack 100 includes two spaced apart fixing frames 20, a side plate 30 fixed to each fixing frame 20 at one of the ends of side plate 30 and two supporting rails 32 extending from the two side plates 30. The two supporting rails 32 extend toward each other. The two side plates 30 are parallel to each other. The two supporting rails 32 can support a server when the server is placed between the two side plates 30.

The server rack 100 further includes two guiding members 60. Each guiding members 60 is rotatably fixed to a free end of the side plate 30 away from the fixing frame 20. The guiding member 60 includes a base plate 62 connected to a lateral side of the side plate 30 and a guiding portion 64 protruding from an inner side of the base plate 62, and thus presenting the appearance of a depression. The guiding portion 64 includes a wedge portion 66 extending from the inner side of the base plate 62 toward the fixing frame 20. The guiding member 60 is rotatable to a first position where the guiding portion 64 positioned in front of one end of the supporting rail 32 away from the fixing frame 20. When installing the server, the server is firstly placed between two wedge portions 66, and then the server is pushed toward the fixing frame 20 so that the server is pushed onto the two supporting rails 32. The guiding member 60 is rotatable between the first position and a second position. When the guiding member 60 is in the second position, the guiding portion 64 is positioned above one end of the supporting rail 32 away from the fixing frame 20.

The guiding portion 64 further includes a positioning block 68 fixed to a free end of the wedge portion 66 away from the base plate 62. The positioning blocks 68 of the two guiding members 60 are parallel to each other. The guiding portion 64 further includes a supporting portion 70 extending from an end of the positioning block 68 away from the wedge portion 66 toward the fixing frame 20. The supporting portion 70 stops at the inner side of the base plate 62.

The guiding member 60 further includes a guiding rail 72 perpendicularly extending from a lower edge of the base plate 62. The guiding rails 72 of the two guiding members 60 extend toward each other. When the guiding member 60 is in the first position, the guiding rail 72 and the supporting rail 32 are in a same plane. In this way, when the server is installed, the server is first placed on the two guiding rails 72, and then pushed along the guiding portion 64 onto the supporting rail 32.

The side plate 30 includes a fixing plate 34. The fixing plate 34 defines a fixing hole 36. The base plate 62 defines a through hole 74. The guiding member 60 further includes a positioning member 76. The positioning member 76 includes a positioning shaft 78 and a positioning portion 80 fixed to an end of the positioning shaft 78 away from the fixing plate 34. The positioning shaft 78 passes through the through hole 74 and is fixed in the fixing hole 36. An edge of the positioning portion 80 is located beyond an edge of the through hole 74. The guiding member 60 is rotatable around the positioning shaft 78. The guiding member 60 further includes an elastic member 82. The elastic member 82 is sleeved on the positioning shaft 78 and is positioned between the positioning portion 80 and the base plate 62. The elastic member 82 can be a spring.

The fixing plate 34 defines an arcuate first sliding slot 38. The first sliding slot 38 is positioned around the fixing hole 36. The fixing plate 34 includes a first locking portion 40 at one end of the first sliding slot 38. The first locking portion 40 defines a first locking hole 42 communicating with the first sliding slot 38. The guiding member 60 defines a first restricting hole 84. The guiding member 60 further includes a first restricting member 86. The first restricting member 86 passes through the first restricting hole 84 and is disposed in the first sliding slot 38. When the guiding member 60 rotates from the second position to the first position, the first restricting member 86 slides along the first sliding slot 38 to the first locking hole 42 and is locked in the first locking hole 42 so that the guiding member 60 is retained in the first position.

The fixing plate 34 defines an arcuate second sliding slot 44. The second sliding slot 44 is symmetrical around the fixing hole 36. The fixing plate 34 includes a second locking portion 46 at one end of the second sliding slot 44. The second locking portion 46 defines a second locking hole 48 communicating with the second sliding slot 44. The guiding member 60 defines a second restricting hole 88. The guiding member 60 further includes a second restricting member 90. The second restricting member 90 passes through the second restricting hole 88 and is disposed in the second sliding slot 44. When the guiding member 60 rotates from the second position to the first position, the second restricting member 90 slides along the second sliding slot 44 to the second locking hole 48 and is locked in the second locking hole 48 so that the guiding member 60 is firmly retained in the first position.

The side plate 30 further includes a sliding plate 50 fixed to the fixing plate 34, and a receiving plate 52 fixed to the fixing frame 20. The receiving plate 52 includes two opposite sliding rails 54. The sliding plate 50 is slidably disposed between the two sliding rails 54.

The embodiments shown and described above are only examples. Even though numerous descriptions and advantages of the present technology have been set forth in the foregoing description, together with details of the structure and function of the present disclosure, the disclosure is illustrative only, and changes may be made in the details, including in matters of shape, size, and arrangement of the parts within the principles of the present disclosure, up to and including the full extent established by the broad general meaning of the terms used in the claims.

What is claimed is:

1. A server rack comprising:
    two spaced apart fixing frames;
    two side plates, each side plate fixed to one of the two fixing frames;
    two supporting rails, each supporting rail extending from one of the two the side plates and the two supporting rails extending toward each other for supporting a server between the two side plates; and
    two guiding members, each of the guiding members rotatably fixed to a free end of one of the side plates, each of the guiding members comprising:
        a base plate connected to a lateral side of each of the two side plates, the lateral side of one of the side plates connected to the base plate being away from another one of the side plates; and
        a guiding portion protruding from an inner side of the base plate, the guiding portion comprising a wedge portion extending from the inner side of the base plate toward the fixing frame;
    wherein each guiding member is rotatable to a first position where the guiding portion is positioned in front of one end of each supporting rail spaced from the fixing frame.

2. The server rack as claimed in claim 1, wherein each guiding portion further comprises a positioning block fixed to a free end of the wedge portion spaced from the base plate, each positioning block of each guiding member being parallel to each other.

3. The server rack as claimed in claim 2, wherein the guiding portion further comprises a supporting portion extending from an end of the positioning block spaced from the wedge portion toward the fixing frame, the supporting portion stops at the inner side of the base plate.

4. The server rack as claimed in claim 1, wherein each guiding member further comprises a guiding rail perpendicularly extending from a lower edge of the base plate, two guiding rails of the two guiding members extend toward each other, when the guiding member is in the first position, the guiding rail and the supporting rail are in a same plane.

5. The server rack as claimed in claim 1, wherein each side plate comprises a fixing plate, the fixing plate defines a fixing hole, the base plate defines a through hole, each guiding member further comprises a positioning member, the positioning member comprises a positioning shaft and a positioning portion fixed to an end of the positioning shaft away from the fixing plate, the positioning shaft passes through the through hole and is fixed in the fixing hole, an edge of the positioning portion is located beyond an edge of the through hole, each guiding member is rotatable around each positioning shaft.

6. The server rack as claimed in claim 5, wherein each guiding member further comprises an elastic member, each elastic member is sleeved on each positioning shaft and is positioned between the positioning portion and the base plate.

7. The server rack as claimed in claim 5, wherein each guiding member is rotatable between the first position and a second position, when the guiding member is in the second position, the guiding portion is positioned above one end of the supporting rail away from the fixing frame.

8. The server rack as claimed in claim 7, wherein each fixing plate defines an arcuate first sliding slot, the first sliding slot is positioned around the fixing hole, each fixing plate comprises a first locking portion at one end of the first sliding slot, each first locking portion defines a first locking hole communicating with the first sliding slot, each guiding member defines a first restricting hole, each guiding member further comprises a first restricting member, the first restricting member passes through the first restricting hole and is disposed in the first sliding slot, when the guiding member rotates from the second position to the first position, the first restricting member slides along the first sliding slot to the first locking hole and is locked in the first locking hole.

9. The server rack as claimed in claim 7, wherein the fixing plate defines an arcuate second sliding slot, the second sliding slot is symmetrically arranged around the fixing hole, the fixing plate comprises a second locking portion at one end of the second sliding slot, the second locking portion defines a second locking hole communicating with the second sliding slot, the guiding member defines a second restricting hole, the guiding member further comprises a second restricting member, the second restricting member passes through the second restricting hole and is disposed in the second sliding slot, when the guiding member rotates from the second position to the first position, the second restricting member slides along the second sliding slot to the second locking hole and is locked in the second locking hole.

10. The server rack as claimed in claim 5, wherein each side plate further comprises a sliding plate fixed to the fixing plate, and a receiving plate fixed to the fixing frame, the receiving plate comprises two opposite sliding rails, the sliding plate is slidably disposed between the two sliding rails.

11. A server rack comprising:
    two fixing frames;
    two parallel side plates, each side plate fixed to one of the two fixing frames;

two supporting rails, each supporting rail fixed to one of the two the side plates, the two supporting rails facing each other for supporting a server between the two side plates; and two guiding members, each of the two guiding members rotatably fixed to a free end of one of the side plates, each of the guiding members comprising:

a base plate connected to a lateral side of each of the two side plates, the lateral side of one of the side plates connected to the base plate being away from another one of the side plates; and a guiding portion protruding from an inner side of the base plate, the guiding portion comprising a wedge portion extending from the inner side of the base plate toward the fixing frame;

wherein each guiding member is rotatable to a first position where the guiding portion is positioned in front of one end of each supporting rail spaced from the fixing frame.

12. The server rack as claimed in claim 11, wherein each guiding portion further comprises a positioning block fixed to a free end of the wedge portion spaced from the base plate, each positioning block of each guiding members being parallel to each other.

13. The server rack as claimed in claim 12, wherein the guiding portion further comprises a supporting portion extending from an end of the positioning block spaced from the wedge portion toward the fixing frame, the supporting portion stops at the inner side of the base plate.

14. The server rack as claimed in claim 11, wherein each guiding member further comprises a guiding rail perpendicularly extending from a lower edge of the base plate, two guiding rails of the two guiding members extend toward each other, when the guiding member is in the first position, the guiding rail and the supporting rail are in a same plane.

15. The server rack as claimed in claim 11, wherein each side plate comprises a fixing plate, the fixing plate defines a fixing hole, the base plate defines a through hole, each guiding member further comprises a positioning member, the positioning member comprises a positioning shaft and a positioning portion fixed to an end of the positioning shaft away from the fixing plate, the positioning shaft passes through the through hole and is fixed in the fixing hole, an edge of the positioning portion is located beyond an edge of the through hole, each guiding member is rotatable around each positioning shaft.

16. The server rack as claimed in claim 15, wherein each guiding member further comprises an elastic member, each elastic member is sleeved on each positioning shaft and is positioned between the positioning portion and the base plate.

17. The server rack as claimed in claim 15, wherein each guiding member is rotatable between the first position and a second position, when the guiding member is in the second position, the guiding portion is positioned above one end of the supporting rail away from the fixing frame.

18. The server rack as claimed in claim 17, wherein each fixing plate defines an arcuate first sliding slot, the first sliding slot is positioned around the fixing hole, each fixing plate comprises a first locking portion at one end of the first sliding slot, each first locking portion defines a first locking hole communicating with the first sliding slot, each guiding member defines a first restricting hole, the guiding member further comprises a first restricting member, the first restricting member passes through the first restricting hole and is disposed in the first sliding slot, when the guiding member rotates from the second position to the first position, the first restricting member slides along the first sliding slot to the first locking hole and is locked in the first locking hole.

19. The server rack as claimed in claim 17, wherein the fixing plate defines an arcuate second sliding slot, the second sliding slot is symmetrically arranged around the fixing hole, the fixing plate comprises a second locking portion at one end of the second sliding slot, the second locking portion defines a second locking hole communicating with the second sliding slot, the guiding member defines a second restricting hole, the guiding member further comprises a second restricting member, the second restricting member passes through the second restricting hole and is disposed in the second sliding slot, when the guiding member rotates from the second position to the first position, the second restricting member slides along the second sliding slot to the second locking hole and is locked in the second locking hole.

20. The server rack as claimed in claim 15, wherein each side plate further comprises a sliding plate fixed to the fixing plate, and a receiving plate fixed to the fixing frame, the receiving plate comprises two opposite sliding rails, the sliding plate is slidably disposed between the two sliding rails.

* * * * *